United States Patent
Choi et al.

(10) Patent No.: US 9,583,203 B2
(45) Date of Patent: Feb. 28, 2017

(54) SEMICONDUCTOR MEMORY DEVICE AND OPERATION METHOD THEREOF

(71) Applicants: SK hynix Inc., Gyeonggi-do (KR); Industry-University Cooperation Foundation Hanyang University, Seoul (KR)

(72) Inventors: Sung-Wook Choi, Gyeonggi-do (KR); Jung-Hoon Ham, Seoul (KR); Young-Il Kim, Seoul (KR); Sang-Sun Lee, Seoul (KR)

(73) Assignees: SK Hynix Inc., Gyeonggi-do (KR); Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 14/822,390

(22) Filed: Aug. 10, 2015

(65) Prior Publication Data
US 2015/0348620 A1     Dec. 3, 2015

Related U.S. Application Data

(62) Division of application No. 14/106,574, filed on Dec. 13, 2013, now abandoned.

(30) Foreign Application Priority Data

Jun. 12, 2013 (KR) .................. 10-2013-0067075

(51) Int. Cl.
| G11C 16/26 | (2006.01) |
| G11C 16/04 | (2006.01) |
| G11C 16/24 | (2006.01) |
| G11C 16/32 | (2006.01) |
| G11C 11/56 | (2006.01) |

(52) U.S. Cl.
CPC .......... *G11C 16/26* (2013.01); *G11C 11/5642* (2013.01); *G11C 16/0483* (2013.01); *G11C 16/24* (2013.01); *G11C 16/32* (2013.01)

(58) Field of Classification Search
None
See application file for complete search history.

(56) References Cited

U.S. PATENT DOCUMENTS

2006/0239071 A1* 10/2006 Ohta ................. G11C 11/5671
365/185.02

* cited by examiner

*Primary Examiner* — James G Norman
(74) *Attorney, Agent, or Firm* — IP & T Group LLP

(57) ABSTRACT

A semiconductor memory device includes a memory cell suitable for having a predetermined cell state based on a data stored therein, a control signal generation unit suitable for generating a control signal for changing the cell state of the memory cell during a reading operation, an information storage unit suitable for storing a variation status information of the control signal to which a moment when the cell state of the memory cell changes is reflected, and an output unit suitable for outputting the variation status information of the control signal stored in the information storage unit as a signal corresponding to the data stored in the memory cell.

8 Claims, 5 Drawing Sheets

SEMICONDUCTOR MEMORY DEVICE AND OPERATION METHOD THEREOF

CROSS-REFERENCE TO RELATED APPLICATIONS

This application is a division of U.S. patent application Ser. No. 14/106,574 filed on Dec. 13, 2013, which claims priority of Korean Patent Application No. 10-2013-0067075, filed on Jun. 12, 2013. The disclosure of each of the foregoing application is incorporated herein by reference in its entirety.

BACKGROUND

1. Field

Exemplary embodiments of the present invention relate to semiconductor design and more particularly, to a semiconductor memory device for storing data.

2. Description of the Related Art

Semiconductor memory devices are classified into volatile memory devices, such as a Dynamic Random Access Memory (DRAM) device and a Static RAM (SRAM) device, and non-volatile memory devices, such as a Programmable Read Only Memory (PROM) device, an Erasable PROM (EPROM) device, an Electrically EPROM (EEPROM) device, and a flash memory device. The main difference between the volatile memory devices and the non-volatile memory devices is whether the devices retain data when power supply is cut off. In other words, the volatile memory devices lose the data stored therein when power is turned off, while the non-volatile memory devices retain the data stored therein even though power is turned off. Therefore the volatile memory devices require an additional circuit to retain the data stored therein.

The non-volatile memory devices may have better characteristics than the volatile memory devices in terms of retainability of data. However, the volatile memory devices are superior to the non-volatile memory devices in terms of size and speed of the device circuits for the same storage capacity. Therefore, the volatile memory devices or the non-volatile memory devices are selected according to the purpose of a memory system. In short, the volatile memory devices are included in a memory system that mainly requires good access speed and the non-volatile memory devices are included in a memory system that mainly requires retainability of data.

Meanwhile, a flash memory device of the non-volatile memory devices stores a data in a memory cell through a programming operation and an erasing operation. The programming operation is an operation of accumulating electrons in a floating gate of a transistor that constitutes a memory cell, and the erasing operation is an operation of discharging the electrons accumulated in the floating gate of the transistor into a substrate. The flash memory device stores a data of '0' or '1' in a memory cell through the operations, and during a reading operation, it senses the amount of electrons accumulated in the floating gate and decides whether the data stored in the memory cell is '0' or '1' based on the sensing result.

One memory cell stores one bit data and this kind of memory cell is referred to as a single level cell. In these days, however, the flash memory device stores a data of more than one bit in one memory cell, which is referred to as a multi-level cell. In the case of the single level cell, one decision voltage, which is called a single threshold voltage, is required in order to decide whether the data stored in the memory cell is '0' or '1'. In the case of the multi-level cell, at least three threshold voltages are required in order to decide whether the data stored in the memory cell is '00', '01', 10' or '11'.

Data stored in the flash memory device have a data distribution according to a value of the data. The data distribution, however, may overlap with an adjacent data distribution and due to the overlap between the neighboring data distributions, there may occur a read error that the data decided based on the threshold voltage and the data substantially stored in the memory cell during a reading operation. Recent progress in fabrication and design makes data distributions narrower but it also makes margin between the neighboring data distributions narrower as well, which means that the overlap between the neighboring data distributions becomes greater, and thus the probability of the read error becomes higher.

N-bit over-sampling emerges lately to prevent the error. According to the n-bit over-sampling, $(2n)-1$ threshold voltages are used to distinguish different data distributions from each other instead of one threshold voltage.

FIGS. 1 and 2 are data distribution diagrams illustrating the n-bit over-sampling.

FIG. 1 shows a 1-bit over-sampling (A), a 2-bit over-sampling (B), and a 3-bit over-sampling (C). Referring to FIG. 1, the 1-bit over-sampling (A) uses one threshold voltage, and the 2-bit over-sampling (B) uses three threshold voltages. The 3-bit over-sampling (C) uses seven threshold voltages. Since a reading operation has to be performed for each threshold voltage, the reading operation is performed seven times in the case of the 3-bit over-sampling (C).

FIG. 2 exemplarily shows the 3-bit over-sampling being applied to a multi-level cell where a two-bit data is stored in one memory cell.

Referring to FIG. 2, in the case of the multi-level cell that stores a two-bit data, the Most Significant Bit (MSB) and the Least Significant Bit (LSB) have to be decided during the reading operation. Since each of the MSB and the LSB has to be over-sampled at seven threshold voltages, the reading operation has to be performed in a total of 21 times ($21 = 3*\{(2^3)-1\}$).

If a 4-bit over-sampling is applied to a multi-level cell where a two-bit data is stored in one memory cell, the reading operation has to be performed in a total of 45 times ($45=3*\{(2^4)-1\}$). Assumed that it takes approximately 20 μs to perform the reading operation once, it takes approximately 420 μs to read the data stored in the memory cell in the case of the 3-bit over-sampling and approximately 900 μs in the case of the 4-bit over-sampling.

As the number of bits to be over-sampled increases, it takes longer time to perform a reading operation on one memory cell.

SUMMARY

An embodiment of the present invention is directed to a semiconductor memory device that may decrease a time for a reading operation without over-sampling.

In accordance with an embodiment of the present invention, a semiconductor memory device may include a memory cell suitable for having a predetermined cell state based on a data stored therein, a control signal generation unit suitable for generating a control signal for changing the cell state of the memory cell during a reading operation, an information storage unit suitable for storing a variation status information of the control signal to which a moment when the cell state of the memory cell changes is reflected, and an output unit suitable for outputting the variation status information of the control signal stored in the information storage unit as a signal corresponding to the data stored in the memory cell.

In accordance with another embodiment of the present invention, a semiconductor memory device may include a memory cell suitable for having a predetermined cell state based on a data stored therein, a control signal generation unit suitable for generating a control signal for changing the cell state of the memory cell during a reading operation, a counting unit suitable for generating a count value representing a time lapse between a moment when the reading operation is enabled and a moment when the cell state of the memory cell changes, an information storage unit suitable for storing the count value, and an output unit suitable for outputting the count value stored in the information storage unit as a signal corresponding to the data stored in the memory cell.

In accordance with yet another embodiment of the present invention, a semiconductor memory device may include a plurality of memory cells configured in a string structure and coupled with bit lines, a read voltage control unit suitable for changing a voltage level of a read voltage that is applied to a target memory cell to be read among the multiple memory cells, a voltage detection unit suitable for detecting a voltage level of the bit lines based on the read voltage and generating a detection signal when a pass current is formed in the target memory cell, and an information storage unit suitable for storing the voltage level of the read voltage in response to the detection signal.

In accordance with still another embodiment of the present invention, a semiconductor memory device may include a plurality of memory cells configured in a string structure and coupled with bit lines, a read voltage control unit suitable for changing a voltage level of a read voltage that is applied to a target memory cell to be read among the multiple memory cells, a voltage detection unit suitable for detecting a voltage level of the bit lines based on the read voltage and generating a detection signal when a pass current is formed in the target memory cell, a counting unit suitable for generating a count value representing a time lapse between a moment when the reading operation is enabled and a moment when the pass current is formed in the target memory cell, and an information storage unit suitable for storing the count signal in response to the detection signal.

In accordance with still another embodiment of the present invention, a method for operating a semiconductor memory device including a memory cell having a predetermined cell state according to a data stored therein may include applying a control signal for changing the predetermined cell state to the memory cell, detecting a moment when the cell state of the memory cell changes and storing a variation status information of the control signal to which a moment when the cell state of the memory cell changes is reflected and reading the variation status information of the control signal as a value corresponding to the data stored in the memory cell.

The semiconductor memory device in accordance with an embodiment of the present invention may detect the state change of a memory cell that stores a data during a reading operation and may output a data. Through this method, the time taken for performing a reading operation may be decreased.

DETAILED DESCRIPTION

Figure 1:
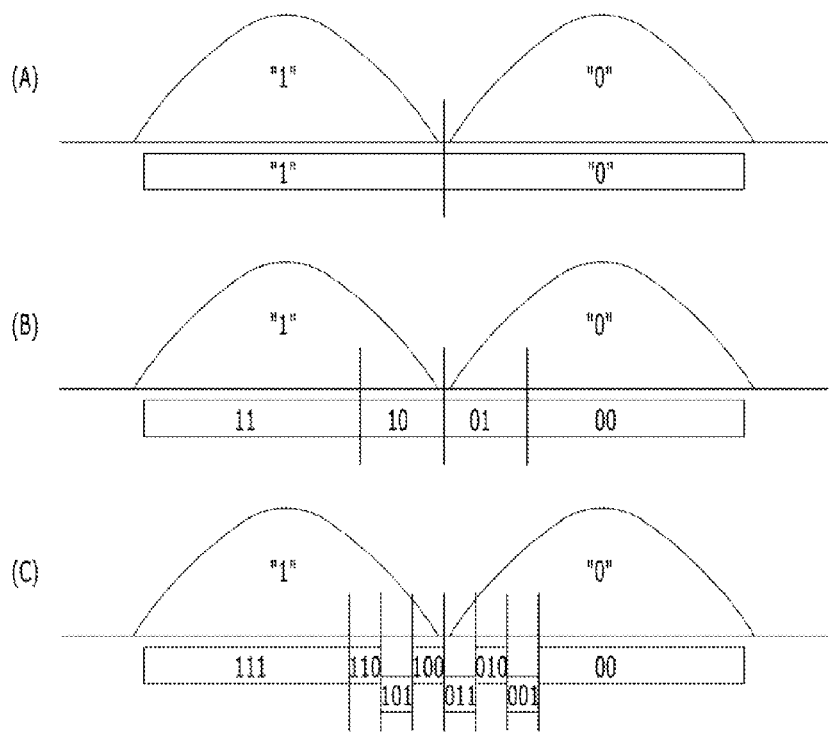
FIGS. 1 and 2 are data distribution diagrams illustrating n-bit over-sampling.
Figure 2:
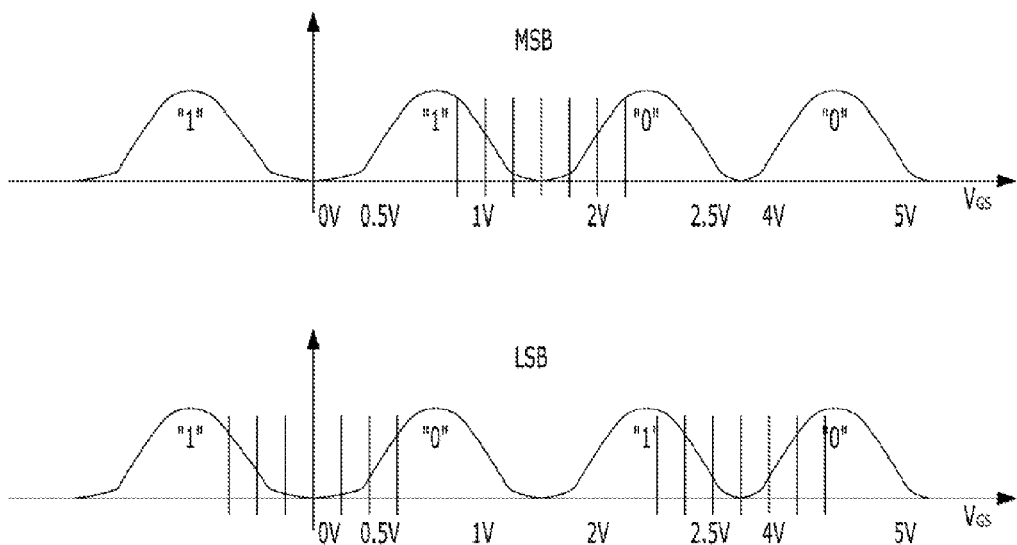

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
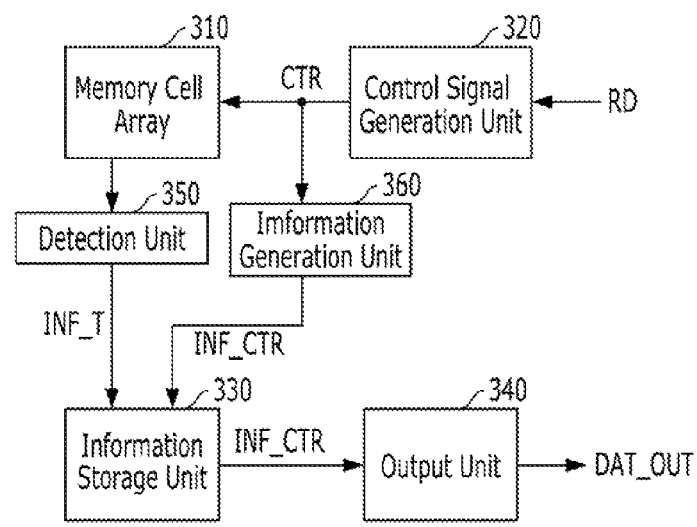
FIG. 3 is a block diagram illustrating a semiconductor memory device in accordance with an embodiment of the present invention.

FIG. 3 is a block diagram illustrating a semiconductor memory device in accordance with an embodiment of the present invention.

Referring to FIG. 3, the semiconductor memory device may include a memory cell array 310, a control signal generation unit 320, an information storage unit 330 an output unit 340, a detection unit 350 and an information generation unit 360.

The memory cell array 310 may include a plurality of memory cells (not shown) for storing data and each memory cell may have predetermined cell states according to the stored data. Herein, the cell states may be diverse information that may represent a data. In a memory cell, for example, formation of a pass current may be the cell state.

The control signal generation unit 320 may generate a control signal CTR in response to a read command signal RD that is enabled during a reading operation. The control signal generation unit 320 may transfer the generated control signal CTR to the memory cell array 310 and the information generation unit 360. The control signal CTR may change the cell state of a memory cell during a reading operation. Various control factors of the control signal CTR may change the cell state of a memory cell according to the structure of a memory cell. For example, the cell state of a memory cell may be changed based on a voltage level, pulse width, or a number of applied pulses of the control signal CTR according to the structure of a memory cell. The information generation unit 360 may generate information INF_CTR representing the control factor of the control signal CTR. For example, the information INF_CTR of the control signal CTR may be one of the voltage level, the pulse width, and the number of applied pulses of the control signal CTR.

The information storage unit 330 may store the information INF_CTR of the control signal CTR in response to a change moment information INF_T output from the detection unit 350. The detection unit 350 may detect a time point of change of the cell state of the memory cell based on the cell state of the memory cell of the memory cell array 310 and may output the change moment information INF_T representing the time point of change of the cell state of the memory cell. In the case of a memory cell to be described below, the change moment information INF_T may represent a moment when a pass current is formed in the memory cell.

Also, as described above, the control signal CTR may have various control factors such as the voltage level, the pulse width, or the number of applied pulses of the control signal CTR according to the structure of the memory cell. The information storage unit 330 stores the information INF_CTR of the control signal CTR such as the voltage level, the pulse width, or the number of applied pulses of the control signal CTR, which may be stored in the information storage unit 330 in response to the change moment information INF_T representing the time point of change of the cell state of the memory cell.

The output unit 340 may receive the information INF_CTR of the control signal CTR stored in the information storage unit 330 and output a signal DAT_OUT indicating the data stored in the memory cell array 310.

The cell state of the memory cell varies according to variation of the control signal CTR, which is represented by the information INF_CTR, and the change moment information INF_T representing the time point of change of the cell state of the memory cell that may vary according to the data stored in the memory cell. That is, the data stored in the memory cell may be identified by the variation status of the control signal CTR represented by the information INF_CTR of the control signal CTR at the time point of change of the cell state of the memory cell represented by the change moment information INF_T, and thus the data stored in the memory cell may be identified by the information INF_CTR corresponding to the change moment information INF_T. Therefore, the information INF_CTR of the control signal CTR that is stored in response to the change moment information INF_T may represent the data stored in the memory cell. The output unit 340 may generate the signal DAT_OUT indicating the data stored in the memory cell array 310 based on the information INF_CTR representing the variation status of the control signal CTR at the time point of change of the cell state of the memory cell. This will be described in detail later by referring to an embodiment.

For clear description, it is assumed that the cell state of the memory cell may vary according to the number of pulses of the control signal CTR. The number of pulses of the control signal CTR is the information INF_CTR of the control signal CTR in this example.

Also, it is assumed that the pass current is formed in a memory cell where a data of '0' is stored when the number of pulses of the control signal CTR is '3'; and the pass current is formed in a memory cell where a data of '1' is stored when the number of pulses of the control signal CTR is '6'. In this case, the information INF_CTR of '3' generated by the information generation unit 360 may be stored in the information storage unit 330 when the change moment information INF_T is input to the information storage unit 330 at the third pulse of the control signal CTR. The information INF_CTR of '6' generated by the information generation unit 350 may be stored in the information storage unit 330 when the change moment information INF_T is input to the information storage unit 330 at the sixth pulse of the control signal CTR. The output unit 340 may generate the signal DAT_OUT indicating the data '0' or '1' stored in the memory cell array 310 based on the information INF_CTR '3' or '6' that is generated by the information generation unit 360 based on the number of pulses of the control signal CTR and represents the variation status of the control signal CTR at the time point of change of the cell state of the memory cell, and thus the data stored in the memory cell or the change moment information INF_T is input to the information storage unit 330 at the third or sixth pulse of the control signal CTR.

The semiconductor memory device in accordance with the embodiment of the present invention may change the cell state of a memory cell where a data is stored according to the variation of the control signal CTR during a reading operation and store the variation information of the control signal CTR at a moment when the cell state of the memory cell changes. The stored variation information of the control signal CTR corresponding to the moment when the cell state of the memory cell changes may be outputted as information indicating the data stored in the memory cell.

Figure 4:
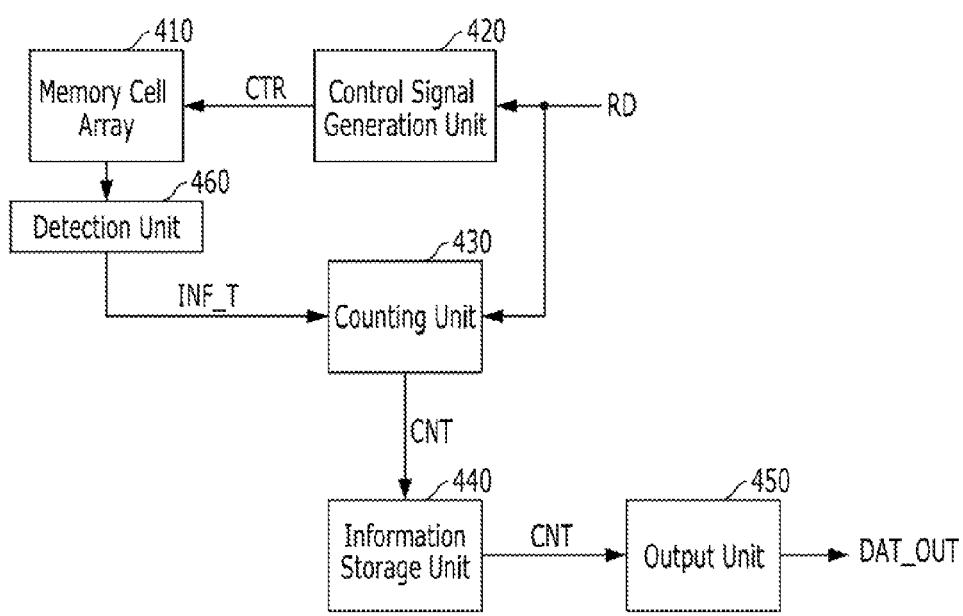
FIG. 4 is a block diagram illustrating a semiconductor memory device in accordance with another embodiment of the present invention.

FIG. 4 is a block diagram illustrating a semiconductor memory device in accordance with another embodiment of the present invention.

Referring to FIG. 4, the semiconductor memory device includes a memory cell array 410, a control signal generation unit 420, a counting unit 430, an information storage unit 440, an output unit 450, and a detection unit 460.

The memory cell array 410 includes a plurality of memory cells for storing data and each memory cell has a predetermined cell state according to the stored data. The control signal generation unit 420 generates a control signal CTR in response to a read command signal RD. The control signal generation unit 420 transfers the generated control signal CTR to the memory cell array 410.

The detection unit 460, substantially the same as the detection unit 350 shown in FIG. 3, may detect a time point of change of the cell state of the memory cell based on the cell state of the memory cell of the memory cell array 310 and may output the change moment information INF_T representing the time point of change of the cell state of the memory cell.

The counting unit 430 may perform a counting operation in response to the read command signal RD and the change moment information INF_T output from the detection unit 460. The counting unit 430 may generate a count value CNT through a counting operation that is performed from a moment when the read command signal RD is enabled to a moment when the change moment information INF_T is enabled.

The count value CNT may correspond to the information INF_CTR of the control signal CTR such as the voltage level, the pulse width, or the number of applied pulses of the control signal CTR, which may be stored in the information storage unit 330 in response to the change moment information INF_T representing the time point of change of the cell state of the memory cell, as described with reference to FIG. 3.

The information storage unit 440 may store the count value CNT and the output unit 450 may receive the count value CNT stored in the information storage unit 440 and output a signal DAT_OUT indicating the data stored in the memory cell array 410.

The cell state of the memory cell varies according to variation of the control signal CTR, which is represented by the count value CNT, and the change moment information INF_T representing the time point of change of the cell state of the memory cell that may vary according to the data stored in the memory cell. That is, the data stored in the memory cell may be identified by the variation status of the control signal CTR represented by the count value CNT at the time point of change of the cell state of the memory cell represented by the change moment information INF_T, and thus the data stored in the memory cell may be identified by the count value CNT corresponding to the change moment information INF_T. Therefore, the count value CNT that is stored in response to the change moment information INF_T may represent the data stored in the memory cell. The output unit 450 may generate the signal DAT_OUT indicating the data stored in the memory cell array 310 based on the count value CNT representing the variation status of the control signal CTR at the time point of change of the cell state of the memory cell. This will be described in detail later by referring to an embodiment.

For clear description, it is assumed that the cell state of the memory cell may vary according to the enabling time of the control signal CTR, which may be identified by the enabling time of the read command signal RD. The count value CNT may represent the variation status of the control signal CTR in this example.

Also, it is assumed that the pass current is formed in a memory cell where a data of '0' is stored when the control signal CTR of a predetermined voltage is applied for approximately 50 μs from enablement of the read command signal RD; and the pass current is formed in a memory cell where a data of '1' is stored when the control signal CTR of a predetermined voltage is applied for 80 μs from enablement of the read command signal RD. In this case, the count value CNT of approximately 50 μs generated by the counting unit 430 may be stored in the information storage unit 440 when the change moment information INF_T is input to the counting unit 430 approximately 50 μs after enablement of the read command signal RD. The count value CNT of 80 μs generated by the counting unit 430 may be stored in the information storage unit 440 when the change moment information INF_T is input to the counting unit 430 approximately 80 μs after enablement of the read command signal RD. The output unit 450 may generate the signal DAT_OUT indicating the data or stored in the memory cell array 310 based on the count value CNT of '50 μs' or '80 μs' that is generated by the counting unit 430 based on the time lapse after enablement of the read command signal RD and represents the variation status of the control signal CTR at the time point of change of the cell state of the memory cell, and thus the data stored in the memory cell or the change moment information INF_T is input to the counting unit 430 approximately 50 μs or 80 μs after enablement of the read command signal RD.

The semiconductor memory device in accordance with the embodiment of the present invention may change the cell state of a memory cell where a data is stored according to the variation of the control signal CTR during a reading operation and store the variation information of the control signal CTR at a moment when the cell state of the memory cell changes through the count value CNT representing the variation status of the control signal CTR. The stored variation information of the control signal CTR correspond-ing to the moment when the cell state of the memory cell changes may be outputted as information indicating the data stored in the memory cell.

Figure 5:
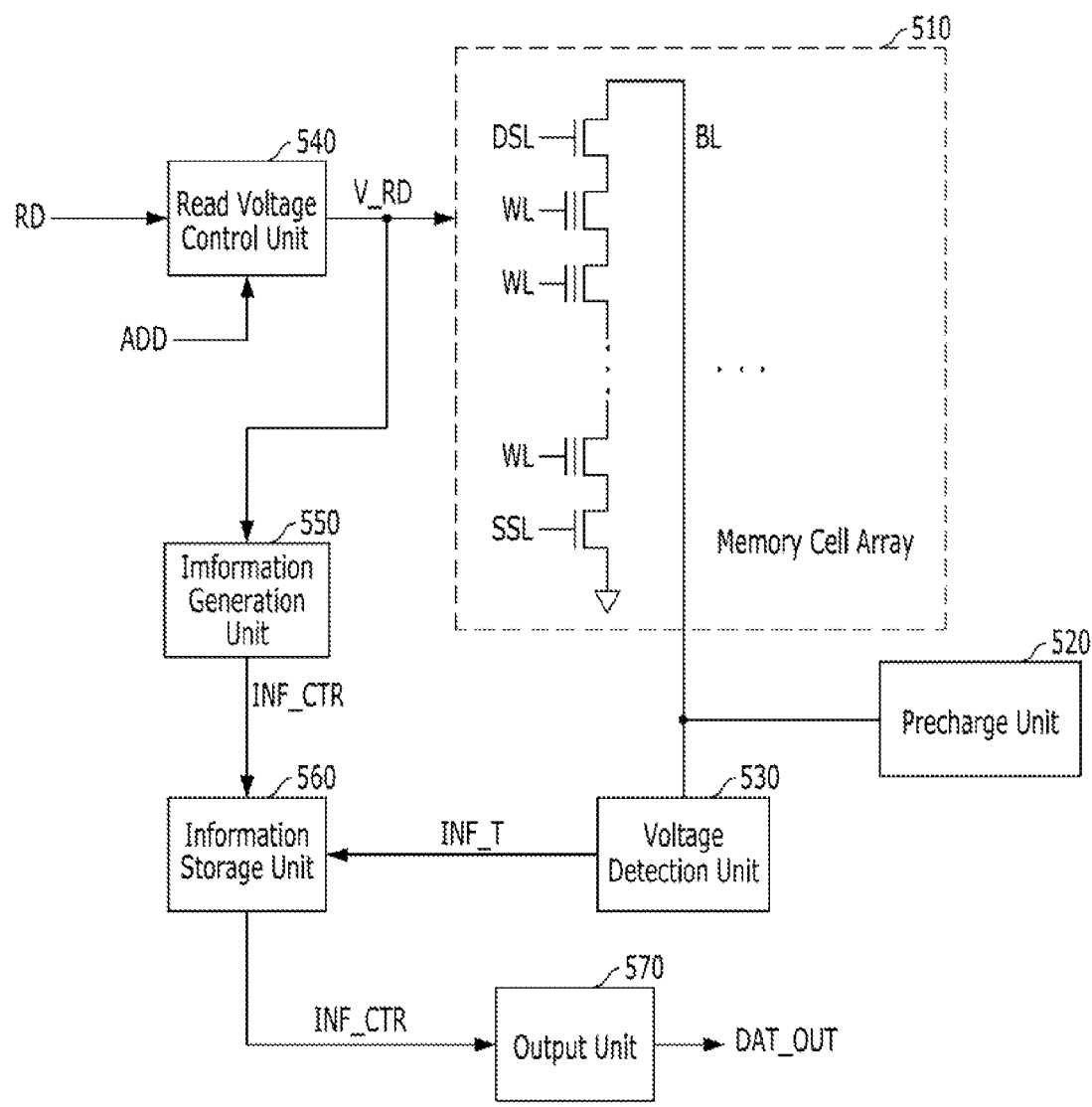
FIG. 5 is a block diagram illustrating a flash memory device corresponding to the semiconductor memory device shown in FIG. 3.

FIG. 5 is a block diagram illustrating a flash memory device corresponding to the semiconductor memory device shown in FIG. 3.

Referring to FIG. 5, the flash memory device may include a memory cell array 510, a precharge unit 520, a voltage detection unit 530, a read voltage control unit 540, an information generation unit 550, an information storage unit 560, and an output unit 570.

The memory cell array 510, which may correspond to the memory cell array 310 shown in FIG. 3, may be coupled with bit lines BL and includes a plurality of memory cells in a string structure. Gates of the memory cells may be coupled with a drain selection line DSL, a plurality of word lines WL and a source selection line SSL. The drain selection line DSL and the source selection line SSL may be enabled during a reading operation, and a read voltage V_RD may be applied to a memory cell where a data to be read is stored, while a pass voltage (not shown) may be applied to the rest of the memory cells. The memory cells to which the pass voltage is applied may be turned on and ready to form a pass current. The read voltage V_RD may be applied to a word line WL corresponding to an address ADD in response to a read command signal RD that may be enabled during a reading operation and may correspond to the control signal CTR shown in FIG. 3.

The precharge unit 520 may precharge the bit lines BL. During a reading operation, the bit lines BL may be precharged by the precharge unit 520, and the voltage level of the precharged bit lines BL may be changed according to the read voltage V_RD. Subsequently, the voltage detection unit 530 may detect the voltage level of the bit lines BL and output the change moment information INF_T representing a moment when the pass current is formed in the memory cell. The change moment information INF_T is described with reference to FIGS. 3 and 4.

The voltage level of the read voltage control unit 540 may vary according to a time. For example, the read voltage V_RD may increase gradually from a predetermined minimum voltage level.

The information generation unit 550 may generate the information INF_CTR based on the read voltage V_RD. For example, the information INF_CTR of the read voltage V_RD may be the voltage level of the read voltage V_RD. The information storage unit 560 stores the information INF_CTR of the read voltage V_RD in response to a change moment information INF_T output from the voltage detection unit 530. The voltage detection unit 530 may detect a time point of change of the cell state of the memory cell based on the cell state of the memory cell of the memory cell array 510 and output the change moment information INF_T representing the time point of change of the cell state of the memory cell. In the embodiment, the change moment information INF_T may represent a moment when the pass current is formed in the memory cell. The output unit 570 may receive the information INF_CTR of the read voltage V_RD stored in the information storage unit 560 and output a signal DAT_OUT indicating the data stored in the memory cell to be read.

As described above with reference to FIG. 3, the data stored in the memory cell to be read may be identified by the variation status or the voltage level of the read voltage V_RD represented by the information INF_CTR of the read voltage V_RD at the time point of change of the cell state of the memory cell represented by the change moment information INF_T, and thus the data stored in the memory cell to be read may be identified by the information INF_CTR corresponding to the change moment information INF_T. Therefore, the information INF_CTR of the read voltage V_RD, which is stored in response to the change moment information INF_T, may represent the data stored in the memory cell to be read.

Hereafter, a circuit operation is briefly described. The reading operation is described based on the assumption that the target memory cell to be read stores a predetermined data.

The precharge unit 520 may precharge bit lines BL during the reading operation. Subsequently, the read voltage control unit 540 may apply the read voltage V_RD to the word line WL corresponding to the address ADD. The voltage level of the read voltage V_RD may vary during the reading operation, and the moment when the target memory cell to be read is turned on may depend on the voltage level of the read voltage V_RD.

The moment when the target memory cell to be read is turned on may affect the moment when a pass current is formed, which may be the cell state of the memory cell. The moment when a pass current is formed or the time point of change of the cell state of the memory cell may be the moment when the voltage level of the precharged bit lines BL starts to decrease.

The voltage detection unit 530 may detect a moment when the voltage level of the bit lines BL starts to decrease and output the change moment information INF_T to the information storage unit 560. The information storage unit 560 may stores the voltage level of the read voltage V_RD as the information INF_CTR of the read voltage V_RD generated by the information generation unit 550 in response to the change moment information INF_T. The output unit 570 may generate the signal DAT_OUT indicating the data stored in the memory cell array 310 based on the information INF_CTR representing the variation status or the voltage level of the read voltage V_RD at the time point of change of the cell state of the memory cell.

The semiconductor memory device in accordance with the embodiment of the present invention may change the cell state of a memory cell where a data is stored according to the variation status or the voltage level of the read voltage V_RD during a read operation and store the variation status or the voltage level of the read voltage V_RD at a moment when the cell state of the memory cell changes. The stored the variation status or the voltage level of the read voltage V_RD corresponding to the moment when the cell state of the memory cell changes may be outputted as information indicating the data stored in the memory cell to be read.

Figure 6:
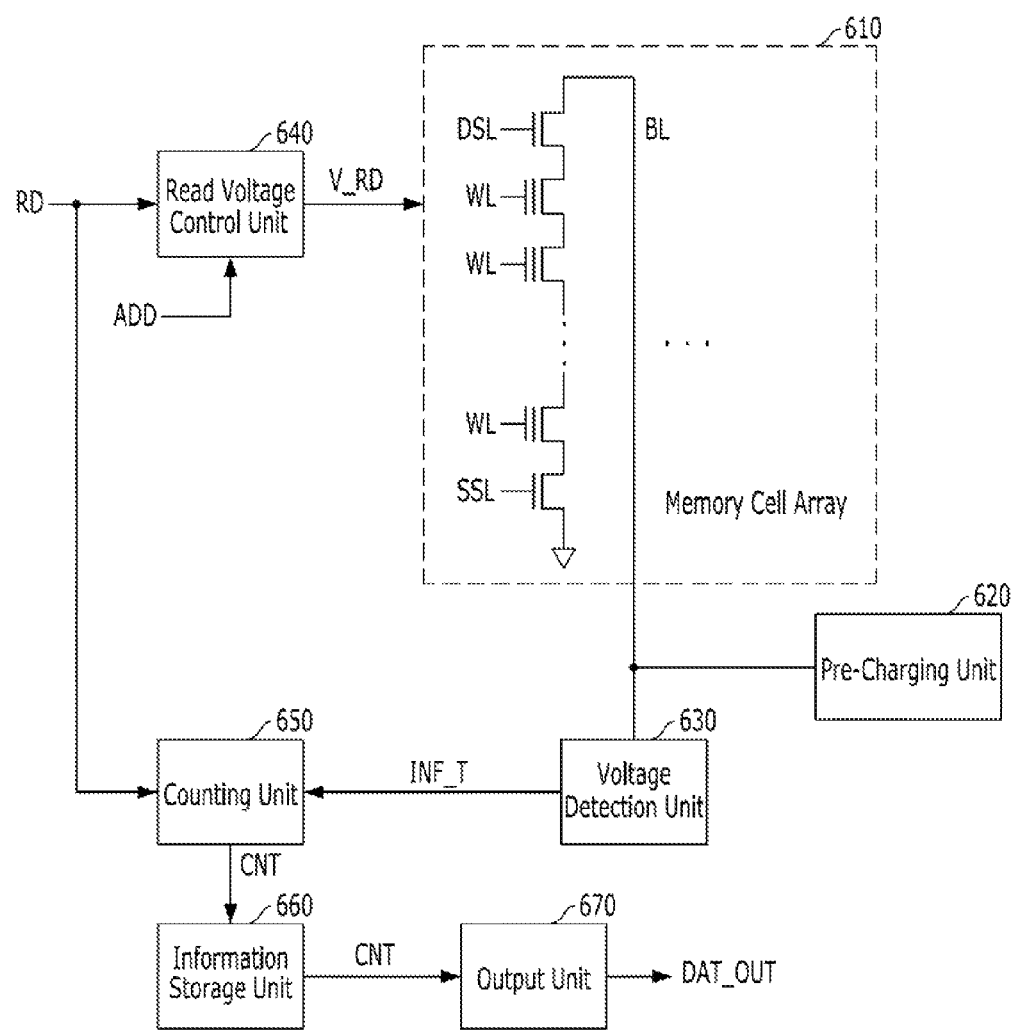
FIG. 6 is a block diagram illustrating a flash memory device corresponding to the semiconductor memory device shown in FIG. 4.

FIG. 6 is a block diagram illustrating a flash memory device corresponding to the semiconductor memory device shown in FIG. 4.

Referring to FIG. 6, the flash memory device includes a memory cell array 610, a precharge unit 620, a voltage detection unit 630, a read voltage control unit 640, a counting unit 650, an information storage unit 660, and an output unit 670.

The memory cell array 610, the precharge unit 620, the voltage detection unit 630, and the read voltage control unit 640 may be substantially the same as the memory cell array 510, the precharge unit 520, the voltage detection unit 530 and the read voltage control unit 540 described above with reference to FIG. 5.

Similar to the counting unit 430 shown in FIG. 4, the counting unit 650 may perform a counting operation in response to the read command signal RD and the change moment information INF_T output from the voltage detection unit 630. The counting unit 650 may generate a count value CNT through a counting operation from a moment when the read command signal RD is enabled to a moment when the change moment information INF_T is enabled.

The count value CNT may correspond to the information INF_CTR of the read voltage V_RD, which may be stored in the information storage unit 660 in response to the change moment information INF_T representing the time point of change of the cell state of the memory cell to be read.

Similar to the information storage unit 440 shown in FIG. 4, the information storage unit 660 may store the count value CNT in response to the change moment information INF_T output from the voltage detection unit 630 and the output unit 670 may receive the count value CNT stored in the information storage unit 660 and output the signal DAT_OUT indicating the data stored in the target memory cell to be read.

As described above with reference to FIG. 4, the data stored in the memory cell may be identified by the variation status or the voltage level of the read voltage V_RD represented by the count value CNT at the time point of change of the cell state of the memory cell represented by the change moment information INF_T, and thus the data stored in the memory cell may be identified by the count value CNT corresponding to the change moment information INF_T. Therefore, the count value CNT, which is stored in response to the change moment information INF_T, may represent the data stored in the target memory cell to be read.

Hereafter, a circuit operation is briefly described with focus on the difference from the embodiment described with reference to FIG. 5. The reading operation is described based on the assumption that the target memory cell to be read stores a predetermined data.

The counting unit 650 may generate the count value CNT through a counting operation from a moment when the read command signal RD is enabled to a moment when the change moment information INF_T is enabled. The information storage unit 660 may store the count value CNT in response to the change moment information INF_T output from the voltage detection unit 530 and the output unit 670 may receive the count value CNT stored in the information storage unit 660 and output the signal DAT_OUT indicating the data stored in the target memory cell to be read.

The semiconductor memory device in accordance with the embodiment of the present invention may change the cell state of a memory cell where a data is stored according to the variation of the read voltage V_RD, which is represented by the count value CNT of the time lapse from a moment when the read command signal RD is enabled to a moment when the change moment information INF_T is enabled during a reading operation, and store the variation information of the read voltage V_RD at a moment when the cell state of the memory cell changes through the count value CNT representing the variation status of the read voltage V_RD. The stored variation information of the read voltage V_RD corresponding to the moment when the cell state of the memory cell changes may be outputted as information indicating the data stored in the memory cell.

Figure 7:
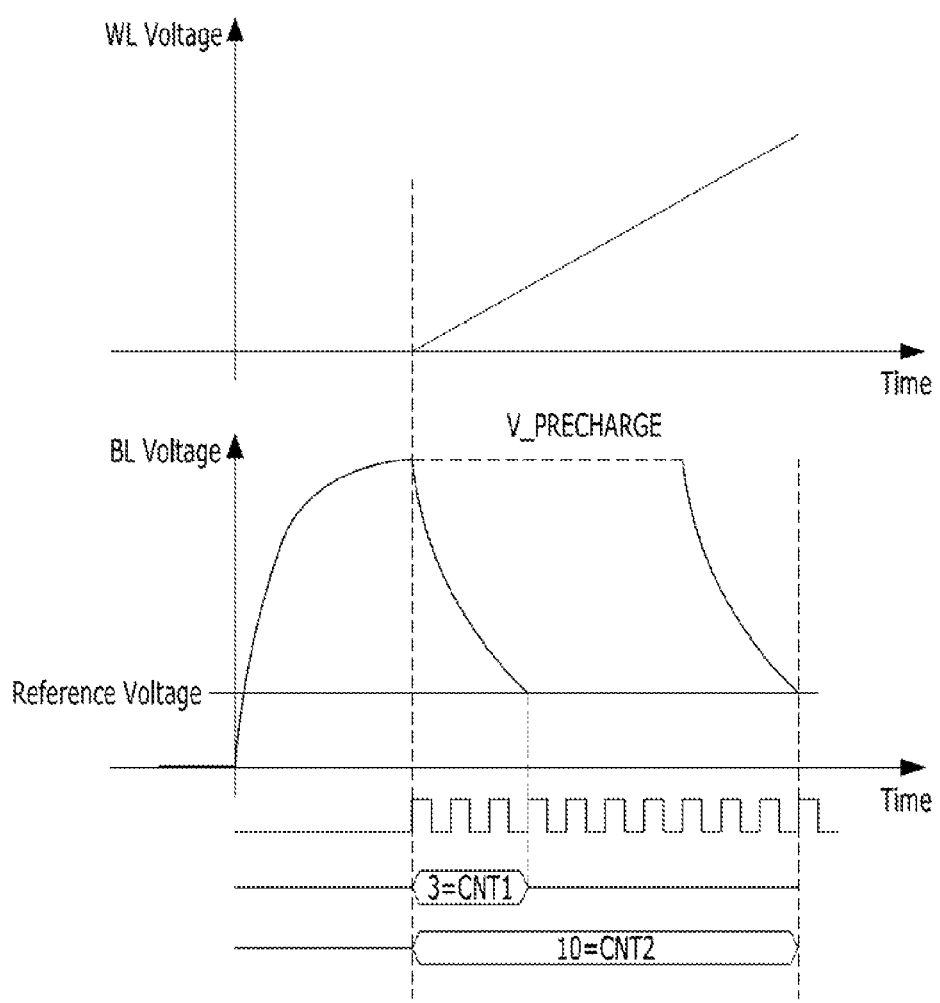
FIG. 7 is a waveform diagram illustrating a reading operation of the flash memory device shown in FIG. 6.

FIG. 7 is a waveform diagram illustrating a reading operation of the flash memory device shown in FIG. 6.

FIG. 7 shows the variation of the voltage level of word lines WL and bit lines BL according to the time. FIG. 7 also shows as an example count values CNT1 and CNT2 corresponding to a data of '1' and a data of '0' stored in the target memory cell to be read, respectively.

Referring to FIGS. 6 and 7, the precharge unit 620 may precharge the bit lines BL during a reading operation. The gradually increasing read voltage V_RD is applied to the word lines WL. As described above, the read voltage V_RD at which the pass current is formed varies according to the data stored in the target memory cell to be read. In other words, as the voltage level of the read voltage V_RD is gradually increased, the pass current is formed earlier in the memory cell with the data of '1' than in the memory cell with the data of '0'.

When the pass current is formed, the voltage level of the bit lines BL may start decreasing. The voltage detection unit 630 detects the start point of the decrease in the voltage level of the bit lines BL and generates the change moment information INF_T. It is also possible that the voltage detection unit 630 detects the voltage level of the bit lines BL being decreased lower than a predetermined reference voltage and enables the change moment information INF_T. The counting unit 650 supplies the count value CNT to the information storage unit 660 in response to the change moment information INF_T. Therefore, the data '3' or '10' stored as the count value CNT1 or CNT2 in the information storage unit 660 in response to the change moment information INF_T, which represents the time point of change of the cell state of the memory cell to be read, may be output by the output unit 670 indicating the data of '1' or the data of '0' stored in the target memory cell to be read, respectively.

The semiconductor memory device in accordance with the embodiment of the present invention may output a cell state corresponding to the data stored in the memory cell, which is herein the data obtained by detecting whether a pass current is formed or not and obtaining a count value by temporally counting the detection of the pass current.

As described above, the semiconductor memory device in accordance with the embodiment of the present invention may detect a variation of the cell state of a memory cell where a data is stored and transform the detected variation into a data. Also, in case of a flash memory device, the read voltage V_RD may vary during a reading operation. Therefore, it is possible to perform a reading operation in a new method. In addition, the semiconductor memory device in accordance with the embodiment of the present invention may reduce read time because it requires a precharge operation once and a reading operation once.

While the present invention has been described with respect to the specific embodiments, it will be apparent to those skilled in the art that various changes and modifications may be made without departing from the spirit and scope of the invention as defined in the following claims.

Also, in the embodiment of the present invention described above, the change moment information INF_T is generated in FIGS. 5 and 6 by detecting the voltage level of the bit lines BL. However, it is also possible to detect a pass current transferred through a transistor that is turned on by the source section line SSL and generates the change moment information INF_T.

Also, logic gates and transistors may be realized in different positions and kinds according to the polarity of an input signal in the above embodiments of the present invention.

What is claimed is:

1. A semiconductor memory device, comprising: a plurality of memory cells configured in a string structure and coupled with bit lines; a read voltage control unit suitable for changing a voltage level of a read voltage that is applied to a target memory cell to be read among the multiple memory cells; a voltage detection unit suitable for detecting a voltage level of the bit lines based on the read voltage and generating a detection signal when a pass current is formed in the target memory cell; a counting unit suitable for generating a count value representing a time lapse between a moment when the reading operation is enabled and a moment when the pass current is formed in the target memory cell; and an information storage unit suitable for storing the count signal in response to the detection signal, wherein the voltage level of the read voltage is increased gradually from a predetermined minimum voltage during the read operation.

2. The semiconductor memory device of claim 1, wherein the counting unit performs a counting operation from a moment when the reading operation is enabled to a moment when the detection signal is enabled.

3. The semiconductor memory device of claim 1, further comprising a precharge unit suitable for precharging the bit lines to a predetermined voltage.

4. The semiconductor memory device of claim 1, wherein the voltage detection unit detects the pass current passing through the multiple memory cells.

5. The semiconductor memory device of claim 1, wherein the pass current of the target memory cell is generated by gradually increasing the voltage level of the read voltage.

6. A semiconductor memory device, comprising: a memory cell suitable for having a predetermined cell state based on a data stored therein; a control signal generation unit suitable for generating a control signal for changing the cell state of the memory cell during a reading operation; a counting unit suitable for generating a count value representing a time lapse between a moment when the reading operation is enabled and a moment when the cell state of the memory cell changes; an information storage unit suitable for storing the count value; and an output unit suitable for outputting the count value stored in the information storage unit as a signal corresponding to the data stored in the memory cell, wherein a voltage level of a read voltage is increased gradually from a predetermined minimum voltage during the read operation.

7. The semiconductor memory device of claim 6, wherein the counting unit performs a counting operation from the moment when the reading operation is enabled to the moment when the cell state of the memory cell varies to generate the count value.

8. The semiconductor memory device of claim 6, wherein the cell state includes formation of a pass current of the memory cell.

* * * * *